United States Patent [19]

Eguchi

[11] Patent Number: 5,083,184

[45] Date of Patent: Jan. 21, 1992

[54] CAPACITANCE DEVICE

[75] Inventor: Kouhei Eguchi, Tokyo, Japan

[73] Assignee: NEC Corporation, Tokyo, Japan

[21] Appl. No.: 564,250

[22] Filed: Aug. 8, 1990

[30] Foreign Application Priority Data

Aug. 8, 1989 [JP] Japan ................................. 1-205951
Aug. 18, 1989 [JP] Japan ................................. 1-212284

[51] Int. Cl.⁵ ..................... H01L 27/02; H01L 29/34; H01L 23/48; H01L 29/44

[52] U.S. Cl. ...................................... 357/51; 357/54; 357/68; 361/313

[58] Field of Search ............................ 357/51, 54, 68; 361/312, 313, 330

[56] References Cited

U.S. PATENT DOCUMENTS 4,626,881 12/1986 Kishi et al. ............................ 357/51
4,700,457 10/1987 Matsukawa ............................ 357/51
4,827,323 5/1989 Tigelaar et al. ...................... 357/51
4,914,546 4/1990 Alter ..................................... 357/51

OTHER PUBLICATIONS

S. M. Sze, Semiconductor Devices Physics and Technology, John Wiley & Sons, New York, (1985) p. 382.

Primary Examiner—J. Carroll
Attorney, Agent, or Firm—Sughrue, Mion, Zinn, Macpeak & Seas

[57] ABSTRACT

First and second capacitance elements are provided to have the same electric characteristics as each other. A first electrode of the first capacitance element is connected to a second electrode, which is not a counterpart electrode of the first electrode, of the second capacitance element, and a second electrode of the first capacitance element is connected to a first electrode of the second capacitance element. As a result, a capacitance value and a leak current do not change, even if positiveness and negativeness of a bias voltage applied to the connected capacitance elements are reverse.

8 Claims, 5 Drawing Sheets 5,083,184

CAPACITANCE DEVICE

FIELD OF THE INVENTION

This invention relates to a capacitance device, and more particularly, to a capacitance device to be incorporated into an integrated circuit.

BACKGROUND OF THE INVENTION

One type of a conventional capacitance device comprises a SiN dielectric film sandwiched by an Al film and an N+ layer diffused with phosphorus (simply described "P" hereinafter). The N+ diffused layer is formed in a Si substrate, and is connected through an aperture of a $SiO_2$ film provided on the Si substrate to an Al wiring. In this capacitance device, the Al film and the N+ diffused layer function as positive and negative electrodes, and the SiN dielectric film functions as a capacitance layer.

Another type of a conventional capacitance device comprises SiN and $SiO_2$ dielectric films sandwiched by two layers of polycrystal silicon, a first layer of which is provided on a $SiO_2$ film grown on a Si substrate, and a second layer of which is provided on the SiN dielectric film. The first layer of polycrystal silicon is connected through an aperture of a first PSG (phospho silicate glass) film provided partly on the first polycrystal silicon layer and a second PSG film to an Al wiring, and the second layer of polycrystal silicon is connected through apertures of the second PSG film to another Al wiring. In this latter type of the capacitance device, the first and second layers of polycrystal silicon which are connected to the Al wiring and film function as positive and negative electrodes, and the SiN and $SiO_2$ dielectric films functions as a capacitance layer.

As described above, the former type of the conventional capacitance device is fabricated in a process for fabricating a semiconductor device. Therefore, the materials of the two electrodes for sandwiching the dielectric layer are different from each other to make matching with the fabricating process.

However, the former type of the conventional capacitance device has a disadvantage in that a capacitance value is changed in a state that positiveness and negativeness of a bias voltage applied across the electrodes is reverse. A leak current is also changed for the same reason. Although the cause is not clarified, it is considered that those disadvantages are resulted from the difference of material properties (for instance, work functions) of the electrode materials, the different interface states of the dielectric film (for instance, roughness) on the electrode materials, the difference of carrier concentrations caused in the electrode of the semiconductor material which is provided in the semiconductor substrate by the reverse application of the bias voltage, etc.

The latter type of the conventional capacitance device has also the same disadvantages as in the former type of the conventional capacitance device, although it has the electrodes of the same material. In this point, it is considered that those disadvantages are resulted from the aforementioned difference of the interface states, the difference of electron injecting efficiencies caused by the difference of bandgap energies of the two dielectric capacitance layers, etc.

SUMMARY OF THE INVENTION

Accordingly, it is an object of this invention to provide a capacitance device, in which no difference occurs in a capacitance value and a leak current, even if the polarity of a bias voltage is reverse to be applied across the capacitance device.

According to this invention, a capacitance device, comprises: a first capacitance element having first and second electrodes provided to sandwich a first dielectric film; and a second capacitance element having a third electrode of the same material as the first electrode and a fourth electrode of the same material as the second electrode to sandwich a second dielectric film; wherein the first electrode and the fourth electrode are connected, and the second electrode and the third electrode are connected.

BRIEF DESCRIPTION OF THE DRAWINGS

This invention will be explained in more detail in conjunction with appended drawings, wherein:

FIGS. 3A and 3B to 5A and 5B are plan views showing capacitance devices in first to third preferred embodiments according to the invention, and cross sectional views cut along lines 3B—3B in FIG. 3A, 4B—4B in FIG. 4A, and 5B—5B in FIG. 5A, respectively.

DESCRIPTION OF THE PREFERRED EMBODIMENTS

Before explaining a capacitance device in the first preferred embodiment according to the invention, the aforementioned conventional capacitance devices will be explained in FIGS. 1A and 1B, and 2A and 2B.

Figure 1A:
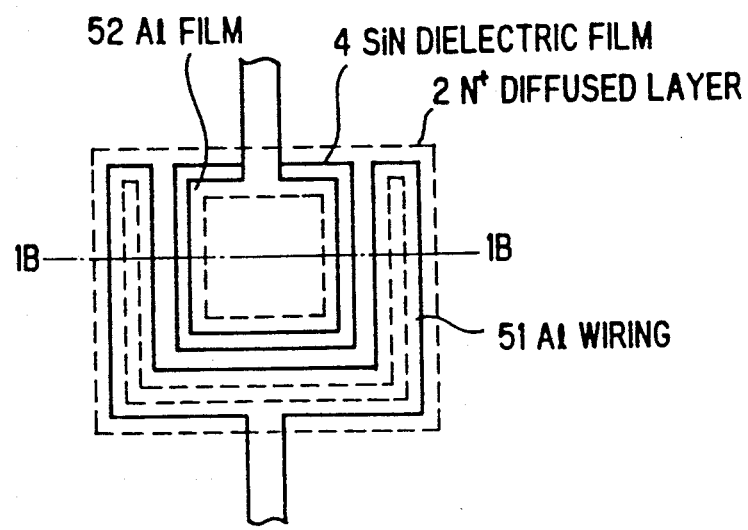
FIGS. 1A and 1B are a plan view showing a conventional capacitance device, and a cross sectional view cut along a line 1B—1B in FIG. 1A, respectively.
Figure 1B:
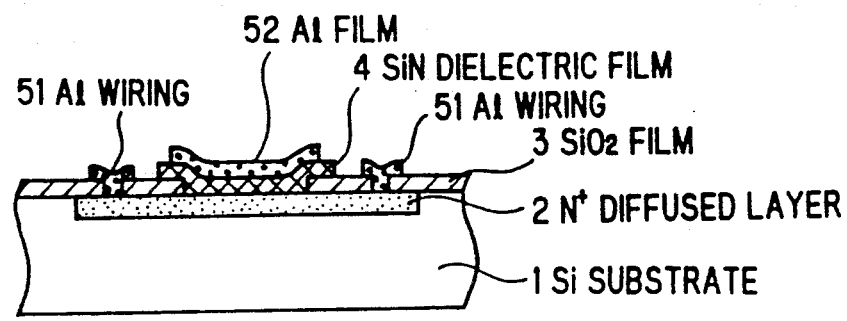

FIGS. 1A and 1B show the former type of the conventional capacitance device which is incorporated in an integrated circuit. This capacitance device comprises a SiN dielectric film 4 as a capacitance layer which is sandwiched by an N+ layer 2 functioning as a first electrode which is diffused with P into a Si substrate 1 and an Al film 52 functioning as a second electrode. The N+ diffused layer 2 is connected through an aperture of a $SiO_2$ film 3 grown on the Si substrate 1 to an Al wiring 51.

This capacitance device provides a predetermined capacitance value in a state that a predetermined bias voltage is applied across the Al wiring 51 and the Al film 52.

Figure 2A:
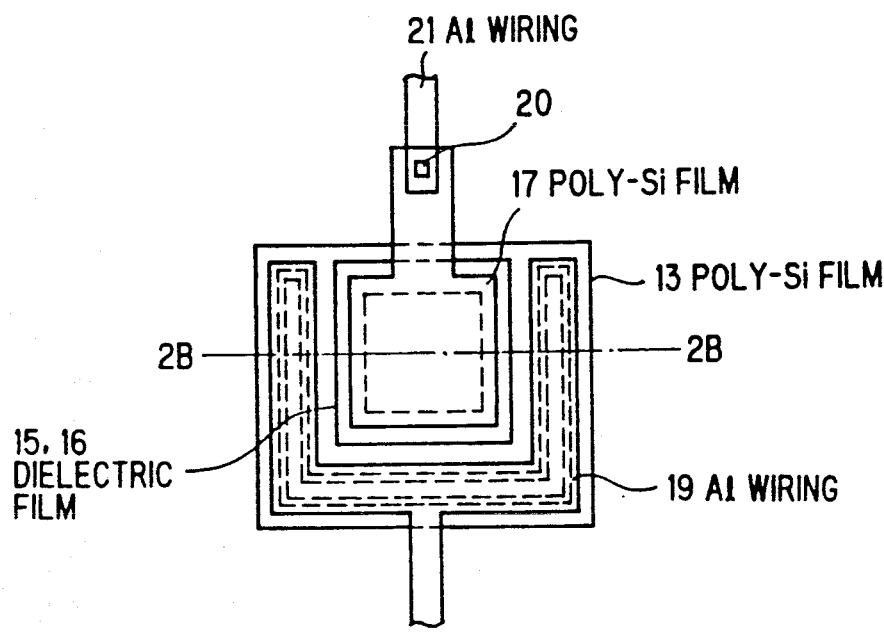
FIGS. 2A and 2B are a plan view showing another conventional capacitance device, and a cross sectional view cut along a line 2B—2B in FIG. 2A, respectively.
Figure 2B:
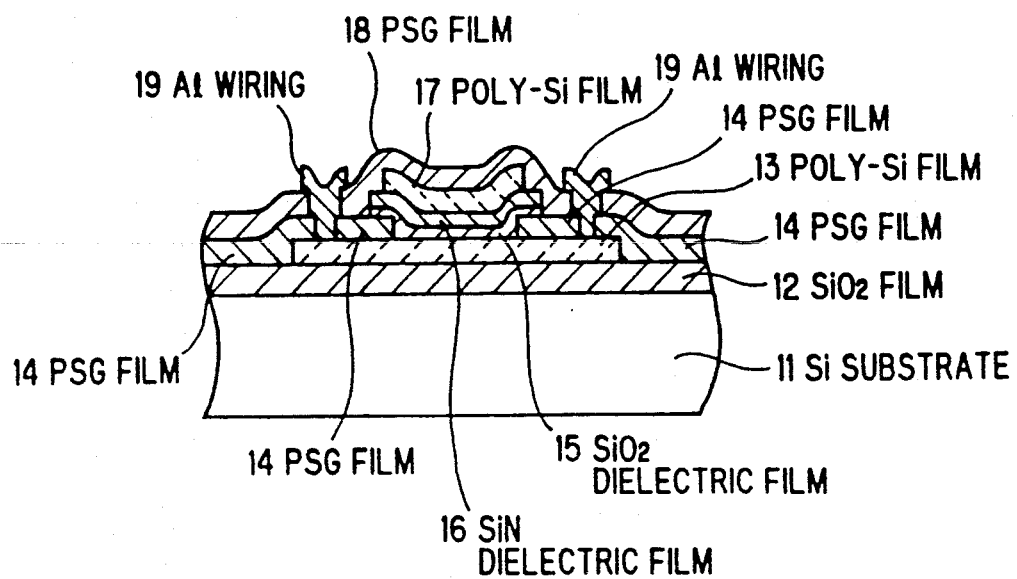

FIGS. 2A and 2B show the latter type of the conventional capacitance device which comprises two dielectric layers including a $SiO_2$ film 15 and a SiN film 16 which are sandwiched by P doped polycrystal silicon films 13 and 17 functioning as first and second electrodes. The P doped polycrystal silicon film 13 (first electrode) is connected through apertures of PSG films 14 and 18 to an Al wiring 19, while the P doped polycrystal silicon film 17 (second electrode) is connected through an aperture 20 of the PSG film 18 to an Al wiring 21. The P doped polycrystal silicon film 13 is provided on a $SiO_2$ film 12 grown on a Si substrate 11.

This capacitance device provides a predetermined capacitance value in a state that a predetermined bias voltage is applied across the Al wirings 19 and 21, that is, the first and second P diffused polycrystal silicon electrodes 13 and 17.

However, the aforementioned disadvantages occur in the former and latter types of the conventional capacitance devices, although those are not described here again.

Figure 3A:
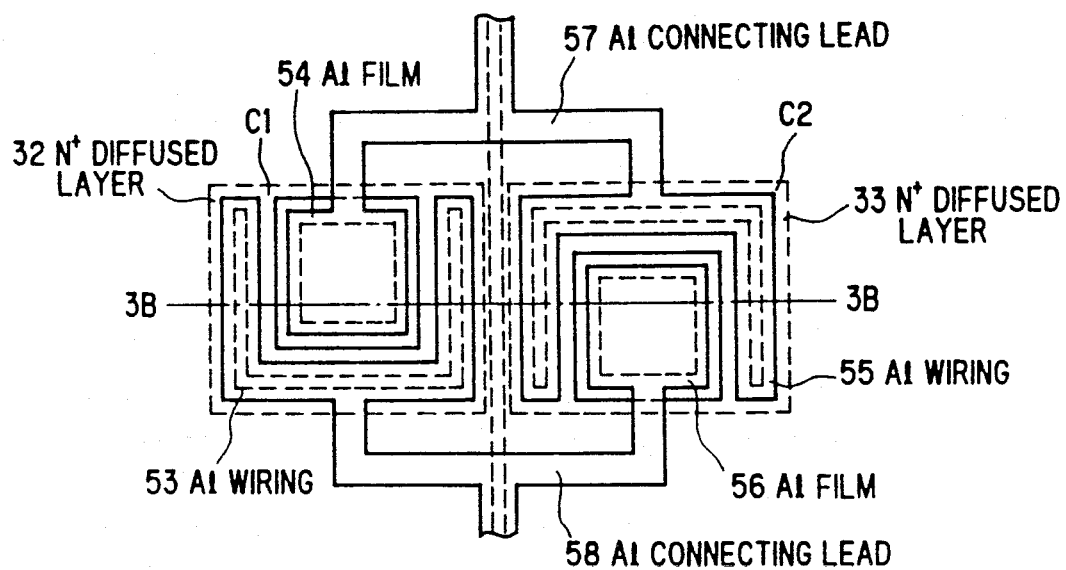
Figure 3B:
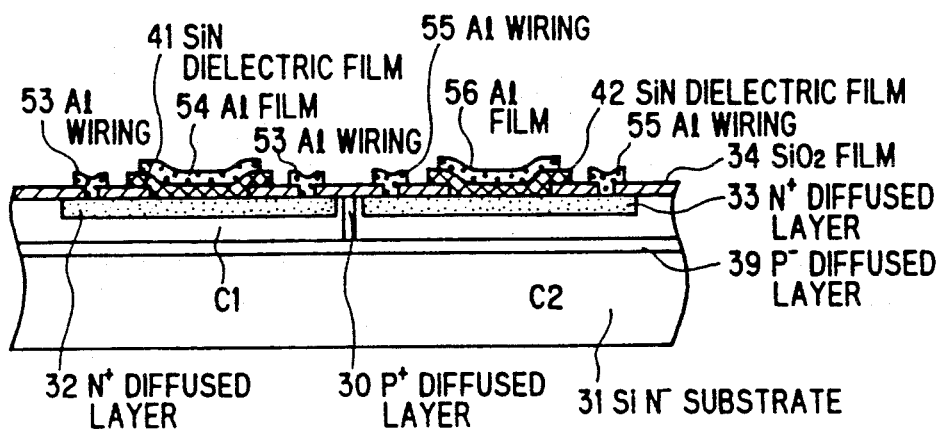

Next, a capacitance device in the first preferred embodiment according to this invention will explained in FIGS. 3A and 3B.

These capacitance devices comprise N+ layers 32 and 33 diffused with P into a Si substrate 31, a SiO$_2$ film 34 with apertures having a thickness of 5000 Å, SiN dielectric films 41 and 42 each having a thickness of 500 Å, Al wirings 53 and 55, and Al films 54 and 56 each having a thickness of 10000 Å. The SiN dielectric film 41 is sandwiched by the Al film 54 and the N+ diffused layer 32 functioning as two electrodes, and the N+ diffused layer 32 is connected through the aperture of the SiO$_2$ film 34 to the Al wiring 53. A capacitive aperture area of the SiO$_2$ film 34 which is partly under the SiN dielectric film 41 is 100 $\mu$m$^2$. While, the SiN dielectric film 42 is sandwiched by the Al film 56 and the N+ diffused layer 33, and the N+ diffused layer 33 is connected through the aperture of the SiO$_2$ film 34 to the Al wiring 55. A capacitive aperture area of the SiO$_2$ film 34 which is partly under the SiN dielectric film 42 is 1000 $\mu$m$^2$. In this structure, the Al wiring 53 and the Al film 56, and the Al wiring 54 and the Al film 55 are connected to each other, respectively, by Al connecting leads 57 and 58. Further, the N+ diffused layers 32 and 33 are electrically insulated by a P− diffused layer 39 and a P+ diffused layer 30. Accordingly, a capacitance device, in which a capacitance element C1 having the SiN dielectric film 41 as a capacitance layer and a capacitance element C2 having the SiN dielectric film 42 as a capacitance layer are connected in parallel to each other, and the different materials functioning as first and second electrodes are connected in series between the both electrodes of the capacitance elements C1 and C2, is obtained. As a result, the electrodes of the different materials are cancelled in regard to the difference of electric potentials, so that a capacitance device having a SiN dielectric film of 500 Å in thickness and a capacitive aperture area of 2000 $\mu$m$^2$ is provided by the combination of the two capacitance elements C1 and C2.

In this preferred embodiment, one capacitance device is obtained by connecting the electrodes of the different materials to each other in the two capacitance elements C1 and C2, as described above. Thus, the change of a capacitance value, and a leak current, etc. caused by the difference between materials of the first and second electrodes can be cancelled.

Figure 4A:
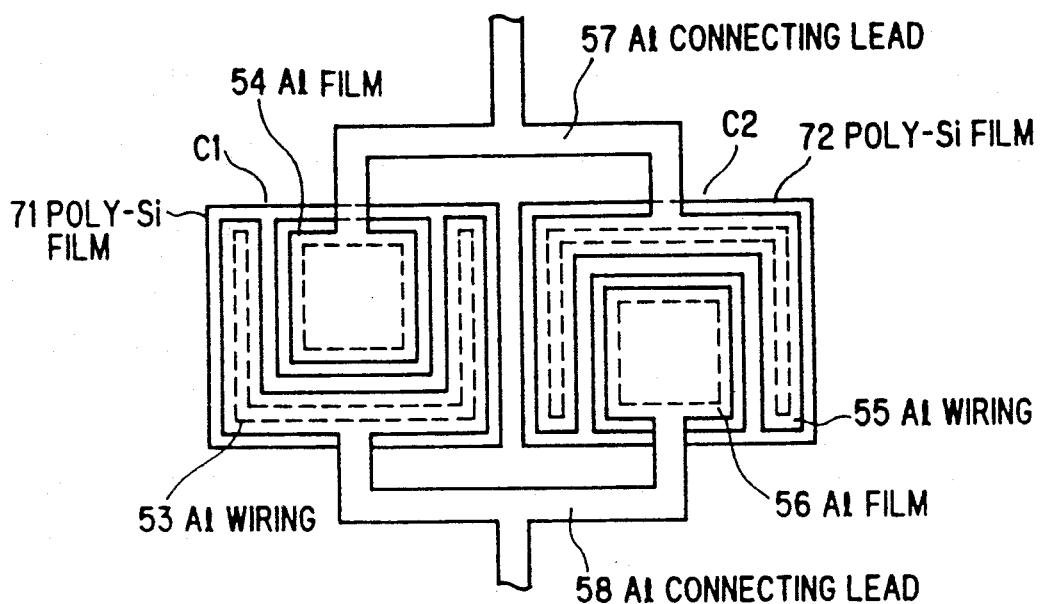
Figure 4B:
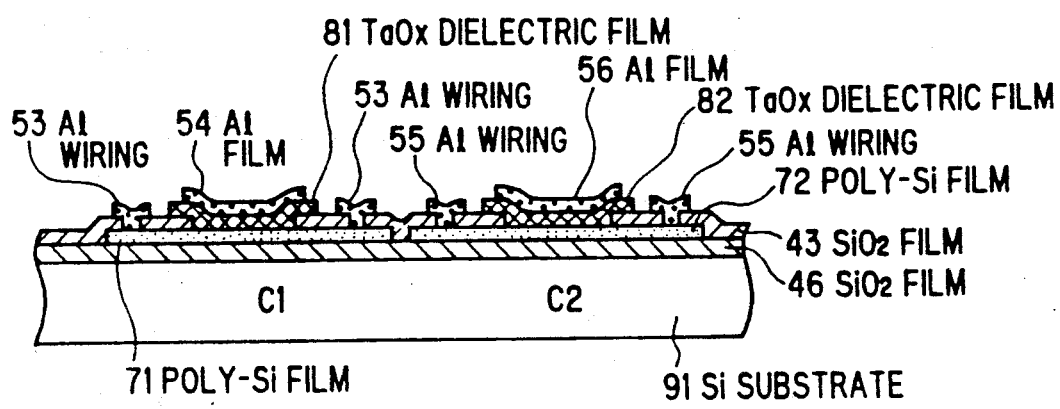

FIGS. 4A and 4B show a capacitance device in the second preferred embodiment which comprises a SiO$_2$ film 46 having a thickness of 10000 Å grown on a Si substrate 91, polycrystal silicon films 71 and 72 provided on the SiO$_2$ film 46, a SiO$_2$ film 43 with apertures having a thickness of 5000 Å, TaOx dielectric films 81 and 82 each having a thickness of 500 Å, Al wirings 53 and 55, and Al films 54 and 56 each having a thickness of 10000 Å.

In this structure, the TaOx dielectric film 81 is sandwiched by the Al film 54 and the polycrystal silicon film 71 functioning as first and second electrodes for a capacitance element C1, and the polycrystal silicon film 71 is connected through an aperture of the SiO$_2$ film 43 to the Al wiring 53. A capacitive aperture area of the SiO$_2$ film 53 which is partly under the TaOx dielectric film 81 is 1000 $\mu$m$^2$. Further, the TaOx dielectric film 82 which is sandwiched by the Al film 56 and the polycrystal silicon film 72 functioning as first and second electrodes for a capacitance element C2, and the polycrystal silicon layer 72 is connected through an aperture of the SiO$_2$ film 43 to the Al wiring 53. A capacitive aperture area of the SiO$_2$ film 53 which is partly under the TaOx dielectric film 82 is 1000 $\mu$m$^2$. Further, the Al wiring 53 and he Al film 56, and the Al film 54 and the Al wiring 55 are connected to each other, respectively, by Al connecting leads 57 and 58. Accordingly, a capacitance device, in which a capacitance element C1 having the TaOx dielectric film 81 and a capacitance element C2 having the TaOx dielectric film 82 are connected in parallel to each other by the Al connecting leads 57 and 58, and the electrodes of the different materials are connected in series between the capacitance elements C1 and C2, is obtained. As a result, one capacitance device having a TaOx dielectric film of 500 Å in thickness, and a capacitance area of 2000 $\mu$m is provided.

Even in this second preferred embodiment, the disadvantages resulted from utilizing electrodes of different materials are solved in the same reason as in the first preferred embodiment.

Figure 5A:
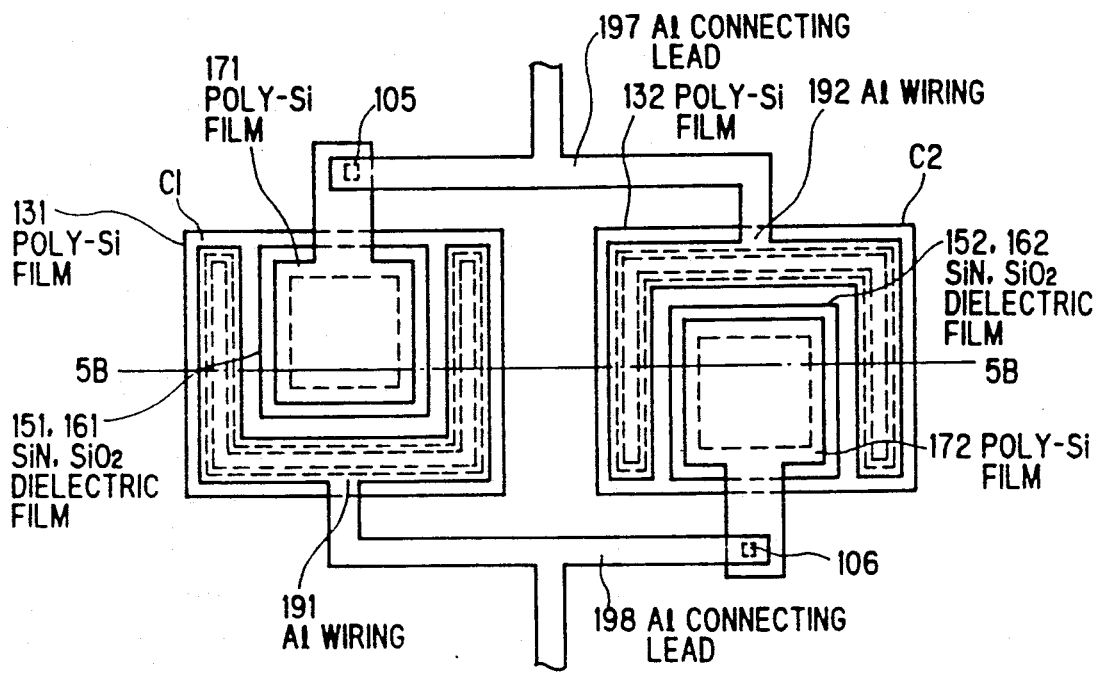
Figure 5B:
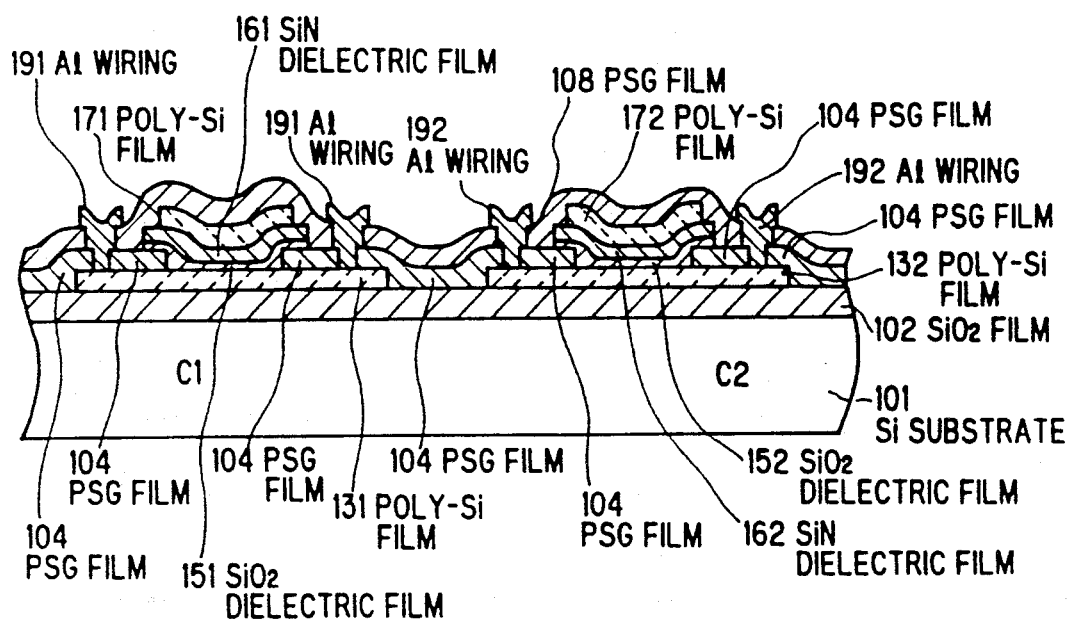

FIGS. 5A and 5B show a capacitance device in the third preferred embodiment according to this invention which comprises a SiO$_2$ film 102 having a thickness of 10000 Å on a Si substrate 101, P doped polycrystal silicon films 131 and 132 each having a thickness of 5000 Å, a PSG film 14 having a thickness of 5000 Å, SiO$_2$ films 151 and 152 each having a thickness of 100 Å, SiN films 161 and 162 each having a thickness of 100 Å, P doped polycrystal silicon films 171 and 172 each having a thickness of 5000 Å, a PSG film 108 having a thickness of 5000 Å, Al wirings 191 and 192 each having a thickness of 1 $\mu$m.

A capacitance dielectric medium for providing a first capacitance element C1 is a two layered structure of the SiO$_2$ film 151 and the SiN film 161, and is sandwiched by the polycrystal silicon film 131 and the polycrystal silicon film 171 functioning as electrodes. The polycrystal silicon film 131 is connected through apertures of the PSG films 104 and 108 to the Al wiring 191, and the polycrystal silicon film 171 is connected through an aperture portion 105 of the PSG film 108 to an Al connecting lead 197. A capacitive aperture area of the PSG film 104 which is partly under the SiO$_2$ film 151 is 1000 $\mu$m$^2$. A capacitance dielectric medium for providing a second capacitance element C2 is a two layered structure of the SiO$_2$ film 152 and the SiN film 162, and is sandwiched by the polycrystal silicon film 132 and the polycrystal silicon film 172 functioning as electrodes, and the polycrystal silicon film 132 is connected through the aperture of the PSG film 104 to the Al wiring 192, and the polycrystal silicon film 172 is connected through an aperture portion 106 of the PSG film 108 to an Al connecting lead 198. A capacitive aperture area of the PSG film 104 which partly is under the SiO$_2$ film 152 is 1000 $\mu$m$^2$. Therefore, the capacitance device having a capacitance dielectric medium of 2000 $\mu$m$^2$ in capacitive aperture are and composed of the SiO$_2$ layers 151 and 152 each having 100 Å in thickness and the SiN layers 161 and 162 each having 100 Å in thickness is obtained in a state that the upper electrode of the capacitance element C1 is connected to the lower electrode of the capacitance element C2, while the lower electrode of the capacitance element C1 is connected to the upper electrode of the capacitance element C2. In this capacitance device, the change of electric characteristics caused by the difference of the materials for the capacitance dielectric medium are cancelled, because the capacitance elements C1 and C2 having the capacitance dielectric medium of the two different materials are provided, such that an electrode facing a dielectric material of the two layered capacitance dielectric medium in the capacitance element C1 is connected to an electrode facing a different dielectric material of the two layered capacitance dielectric in the capacitance element C2, and the remaining electrode of the capacitance element C1 is connected to the remaining electrode of the capacitance element C2 in the same manner.

A capacitance device in a fourth preferred embodiment according to the invention is structured, such that the SiO$_2$ films 151 and 152 of 100 Å in thickness in the third preferred embodiment are replaced by SiN films of 100 Å in thickness, respectively, and the SiN films 161 and 162 of 100 Å in thickness are replaced by Ta$_2$O$_5$ films of 500 Å in thickness, respectively, while the remaining structure is the same as that in the third preferred embodiment.

Thus, a capacitance device having a capacitive aperture area of 2000 μm$^2$ which is provided with the two stacked layers of SiN and Ta$_2$O$_5$ each having a thickness of 500 Å is obtained, so that the same advantage as the third preferred embodiment is realized.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A capacitance device, comprising:
   a first capacitance element having first and second electrodes provided to sandwich a first dielectric film, said second electrode being positioned under said first dielectric film and connected to a first taking-out electrode, and said first electrode being positioned over said first dielectric film and surrounded along a major portion of its periphery by said first taking-out electrode; and
   a second capacitance element having a third electrode of the same material as said first electrode and a fourth electrode of the same material as said second electrode to sandwich a second dielectric film of the same material as said first dielectric film, said fourth electrode being positioned under said second dielectric film and connected to a second taking-out electrode, and said third electrode being positioned over said second dielectric film and surround along a major portion of its periphery by said second taking-out electrode;
   wherein said first taking-out electrode is connected to said third electrode, and said second taking-out electrode is connected to said first electrode.

2. A capacitance device, comprising:
   a first capacitance element composed of a first electrode, a first dielectric film provided on said first electrode, a second dielectric film provided on said first dielectric film, and a second electrode provided on said second dielectric film, said first electrode being connected to a first taking-out electrode, and said second electrode being surrounded along a major portion of its periphery by said first taking-out electrode; and
   a second capacitance element composed of a third electrode of the same material as said first electrode, a third dielectric film provided on said third electrode and of the same material as said first dielectric film, a fourth dielectric film provided on said third dielectric film and of the same material as said second dielectric film, and a fourth electrode provided on said fourth dielectric film and of the same material as said second electrode, said third electrode being connected to a second taking-out electrode, and said fourth electrode being surrounded along a major portion of its periphery by said second taking-out electrode;
   wherein said first taking-out electrode is connected to said third electrode, and said second taking-out electrode is connected to said first electrode.

3. A capacitance device, comprising:
   a first capacitance element having first and second electrodes provided to sandwich a first dielectric film, said second electrode being positioned under said first dielectric film and connected to a first taking-out electrode, and said first electrode being of a four-sided figure to be positioned over said first dielectric film and encircled along three sides thereof by said first taking-out electrode; and
   a second capacitance element having a third electrode of the same material as said first electrode and a fourth electrode of the same material as said second electrode to sandwich a second dielectric film of the same material as said first dielectric film, said fourth electrode being positioned under said second dielectric film and connected to a second taking-out electrode, and said third electrode being of a four-sided figure to be positioned over said second dielectric film and encircled along three sides thereof by said second taking-out electrode;
   wherein said first taking-out electrode is connected to said third electrode, and said second taking-out electrode is connected to said first electrode; and
   a center line of said first electrode being deviated from a center line of said third electrode by a predetermined dimension, said center lines being parallel, such that a point-symmetrical arrangement is provided relative to a middle point of said first and second capacitance elements between a first electrode arrangement, comprising said first electrode and said first taking-out electrode, and a second electrode arrangement, comprising said third electrode and said second taking-out electrode.

4. A capacitance device, according to claim 1, wherein:
   said first and third electrodes are of aluminium films;
   said second and fourth electrodes are of N$^+$ layers each diffused with phosphorus into a substrate of Si; and
   said first and second dielectric films are of SiN films.

5. A capacitance device, according to claim 1, wherein:
   said first and third electrodes are of aluminium films;
   said second and fourth electrodes are of polycrystal silicon films; and
   said first and second dielectric films are of TaOx films.

6. A capacitance device, comprising;
   a first capacitance element composed of a first electrode, a first dielectric film provided on said first electrode, a second dielectric film provided on said first dielectric film, and a second electrode provided on said second dielectric film, said first electrode being connected to a first taking-out electrode, and said second electrode being a four-sided figure encircled along three sides by said first taking-out electrode; and a second capacitance element composed of a third electrode of the same material as said first electrode, a third dielectric film provided on said third electrode and of the same material as said first dielectric film, a fourth dielectric film provided on said third dielectric film and of the same material as said second dielectric film, and a fourth electrode provided on said fourth dielectric film, and of the same material as said second electrode, said third electrode being connected to a second taking-out electrode, and said fourth electrode being a four-sided figure encircled along three sides thereof by said second taking-out electrode;

wherein said first taking-out electrode is connected to said third electrode, and said second taking-out electrode is connected to said first electrode; and a center line of said first electrode being deviated from a center line of said third electrode by a predetermined dimension, said center lines being parallel, such that a point-symmetrical arrangement is provided relative to a middle point of said first and second capacitance elements between a first electrode arrangement, comprising said first electrode and said first taking-out electrode, and a second electrode arrangement, comprising said third electrode and said second taking-out electrode.

7. A capacitance device, according to claim 4, wherein:

said first to fourth electrodes are of polycrystal silicon films;

said first and third dielectric films are of $SiO_2$ films; and said second and fourth dielectric films are of SiN films.

8. A capacitance device, according 4, wherein:

said first to fourth electrodes are of polycrystal silicon films;

said first and third dielectric films are of SiN films; and said second and fourth dielectric films are of $TaO_x$ films.

* * * * *